(12) United States Patent
Kim (10) Patent No.: US 12,444,724 B2
(45) Date of Patent: Oct. 14, 2025

(54) DISPLAY DEVICE

(71) Applicant: SAMSUNG DISPLAY CO., LTD., Yongin-si (KR)

(72) Inventor: Eun Ju Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/316,217

(22) Filed: May 11, 2023

(65) Prior Publication Data

US 2023/0307432 A1    Sep. 28, 2023

Related U.S. Application Data

(63) Continuation of application No. 16/169,788, filed on Oct. 24, 2018, now Pat. No. 11,658,165.

(30) Foreign Application Priority Data

Jan. 8, 2018  (KR) .................... 10-2018-0002353

(51) Int. Cl.
  *H01L 25/16*     (2023.01)
  *H01L 25/075*    (2006.01)
  (Continued)

(52) U.S. Cl.
  CPC ........ *H01L 25/167* (2013.01); *H01L 25/0753* (2013.01); *H10D 86/021* (2025.01);
  (Continued)

(58) Field of Classification Search
  CPC ... H01L 25/167; H01L 33/502; H01L 33/504; H01L 25/0753; H10H 20/8512; H10H 20/8513; H10D 86/451
  See application file for complete search history.

(56) References Cited

U.S. PATENT DOCUMENTS 6,613,610 B2 *  9/2003  Iwafuchi ............. H01L 21/2007
                                                      438/464
6,653,661 B2 * 11/2003  Okazaki .................. H01L 24/97
                                                      257/E33.059
(Continued)

FOREIGN PATENT DOCUMENTS

CN         106483703 A     3/2017
KR      10-2012-0111369 A   10/2012
(Continued)

OTHER PUBLICATIONS

KR1020130137985A machine translation (Year: 2024).*

*Primary Examiner* — Vincent Wall
(74) *Attorney, Agent, or Firm* — Womble Bond Dickinson (US) LLP (57) ABSTRACT

A display device includes a thin film transistor substrate having a thin film transistor, a light emitting element including an ultra-small LED element on the thin film transistor substrate, a pixel electrode connected to one end of the thin film transistor and one end of the light emitting element, a common electrode on the thin film transistor substrate and connected to an other end of the light emitting element, a color conversion layer on the light emitting element and including a plurality of quantum dot materials, and an encapsulation layer on the color conversion layer.

17 Claims, 8 Drawing Sheets

(51) Int. Cl.
  *H10D 86/01* (2025.01)
  *H10D 86/40* (2025.01)
  *H10D 86/60* (2025.01)
  *H10H 20/84* (2025.01)
  *H10H 20/851* (2025.01)
  *H10H 20/852* (2025.01)

(52) U.S. Cl.
  CPC ......... *H10D 86/451* (2025.01); *H10D 86/60* (2025.01); *H10H 20/84* (2025.01); *H10H 20/8512* (2025.01); *H10H 20/8513* (2025.01); *H10H 20/852* (2025.01)

(56) References Cited

U.S. PATENT DOCUMENTS

| | | | |
|---|---|---|---|
| 8,791,474 B1* | 7/2014 | Bibl | G09G 3/2003 257/89 |
| 9,029,880 B2 | 5/2015 | Sakariya et al. | |
| 9,081,248 B2* | 7/2015 | Noh | G02B 5/285 |
| 9,252,375 B2* | 2/2016 | Bibl | H01L 24/83 |
| 9,472,734 B1 | 10/2016 | Chen et al. | |
| 9,484,504 B2* | 11/2016 | Bibl | H01L 33/504 |
| 9,575,228 B2* | 2/2017 | Kim | G02B 5/201 |
| 9,917,235 B2 | 3/2018 | Kim | |
| 9,927,606 B1 | 3/2018 | Sakai | |
| 10,193,042 B1* | 1/2019 | Tsai | H01L 25/0753 |
| 10,276,761 B2* | 4/2019 | Huang | H01L 33/405 |
| 10,446,724 B2* | 10/2019 | Kwon | H01L 25/0753 |
| 10,996,515 B2 | 5/2021 | Kim et al. | |
| 11,221,520 B2* | 1/2022 | Kim | G02F 1/133514 |
| 2003/0015721 A1* | 1/2003 | Slater, Jr. | H01L 33/20 257/676 |
| 2004/0000727 A1* | 1/2004 | Hsu | H01L 33/486 257/E33.072 |
| 2004/0253413 A1* | 12/2004 | Baba | G02B 5/201 428/917 |
| 2005/0275343 A1* | 12/2005 | Tanaka | H10K 59/38 313/506 |
| 2006/0208271 A1* | 9/2006 | Kim | H01L 33/486 257/100 |
| 2007/0090755 A1* | 4/2007 | Eida | B82Y 20/00 313/506 |
| 2007/0131940 A1* | 6/2007 | Wu | H01L 33/505 257/79 |
| 2008/0093606 A1* | 4/2008 | Pan | H01L 24/97 257/E33.001 |
| 2009/0068774 A1* | 3/2009 | Slater, Jr. | H01L 33/62 438/26 |
| 2011/0241036 A1 | 10/2011 | Yoshinaga et al. | |
| 2012/0112220 A1* | 5/2012 | West | H01L 33/62 257/E33.072 |
| 2012/0155076 A1* | 6/2012 | Li | H05B 45/22 362/231 |
| 2012/0168776 A1* | 7/2012 | Nakamura | H01L 27/124 257/E33.056 |
| 2012/0326188 A1* | 12/2012 | Han | H01L 33/60 438/22 |
| 2013/0242228 A1 | 9/2013 | Park et al. | |
| 2014/0159043 A1* | 6/2014 | Sakariya | H01L 25/0753 438/34 |
| 2014/0159064 A1* | 6/2014 | Sakariya | H01L 25/167 257/88 |
| 2014/0159067 A1* | 6/2014 | Sakariya | H01L 24/29 438/28 |
| 2014/0339495 A1* | 11/2014 | Bibl | H01L 33/502 257/13 |
| 2014/0367633 A1* | 12/2014 | Bibl | H01L 33/56 257/13 |
| 2015/0285969 A1 | 10/2015 | Kim et al. | |
| 2015/0362165 A1* | 12/2015 | Chu | H01L 33/32 362/235 |
| 2016/0013167 A1 | 1/2016 | Sakariya et al. | |
| 2016/0062183 A1* | 3/2016 | Sung | G02F 1/133514 349/71 |
| 2016/0070136 A1 | 3/2016 | Jang et al. | |
| 2016/0372514 A1* | 12/2016 | Chang | H01L 27/1259 |
| 2016/0372528 A1* | 12/2016 | Kamura | H01L 31/055 |
| 2017/0031205 A1 | 2/2017 | Lee | |
| 2017/0139276 A1 | 5/2017 | Ulmer et al. | |
| 2017/0179192 A1* | 6/2017 | Zhang | H01L 27/1255 |
| 2017/0183922 A1 | 6/2017 | Nguyen | |
| 2017/0186922 A1 | 6/2017 | Kim et al. | |
| 2017/0227813 A1 | 8/2017 | Park et al. | |
| 2017/0242292 A1 | 8/2017 | Jeon et al. | |
| 2017/0309798 A1 | 10/2017 | Bonar et al. | |
| 2017/0345801 A1* | 11/2017 | Lin | H01L 25/075 |
| 2017/0351149 A1 | 12/2017 | Chu et al. | |
| 2017/0358624 A1* | 12/2017 | Takeya | H01L 33/42 |
| 2018/0059310 A1* | 3/2018 | Bae | G02F 1/136286 |
| 2018/0120631 A1* | 5/2018 | Lee | G02B 5/20 |
| 2018/0120647 A1 | 5/2018 | Suh et al. | |
| 2018/0143497 A1 | 5/2018 | Kim et al. | |
| 2018/0175268 A1* | 6/2018 | Moon | H01L 27/15 |
| 2018/0275461 A1* | 9/2018 | Park | G02F 1/133621 |
| 2019/0041700 A1* | 2/2019 | Koo | G02F 1/1368 |
| 2019/0214376 A1* | 7/2019 | Kim | H01L 33/504 |
| 2021/0296543 A1* | 9/2021 | Aoyama | H01L 33/504 |

FOREIGN PATENT DOCUMENTS

| | | | |
|---|---|---|---|
| KR | 1020130137985 A | * | 12/2013 |
| KR | 10-2015-0094402 A | | 8/2015 |
| KR | 10-2016-0028263 A | | 3/2016 |
| KR | 10-1704334 B1 | | 2/2017 |
| KR | 10-2017-0026959 A | | 3/2017 |
| KR | 10-2017-0084139 A | | 7/2017 |
| KR | 10-2017-0104086 A | | 9/2017 |
| KR | 10-2017-0116300 A | | 10/2017 |
| KR | 10-2017-0116633 A | | 10/2017 |
| KR | 10-2017-0129918 A | | 11/2017 |

* cited by examiner

DISPLAY DEVICE

CROSS-REFERENCE TO RELATED APPLICATIONS

This application is a continuation of U.S. patent application Ser. No. 16/169,788, filed Oct. 24, 2018, which claims priority to and the benefit of Korean Patent Application No. 10-2018-0002353, filed Jan. 8, 2018, the entire content of both of which is incorporated herein by reference.

BACKGROUND

1. Field

Aspects of embodiments of the present invention relate to a display device.

2. Description of the Related Art

Light emitting diodes (LEDs) exhibit relatively good durability even in harsh environmental conditions, and have excellent performance in terms of lifetime and luminance. Recently, researches for applying such LEDs to various display devices have been actively conducted.

As a part of these researches, techniques have been developed for fabricating microscale or nanoscale ultra-compact light emitting diodes by using inorganic crystal structures, for example, structures in which nitride based semiconductors have been grown. For example, an LED may be manufactured to a small size, enough to constitute a pixel of a self-light emitting display device, or the like.

The above information disclosed in this Background section is only for enhancement of understanding of the background of the invention and therefore it may contain information that does not form prior art.

SUMMARY

Aspects of embodiments of the present invention are directed to a display device with improved color reproducibility and color viewing angle.

According to some embodiments of the present invention, there is provided a display device including: a thin film transistor substrate having a thin film transistor; a light emitting element including an ultra-small LED element on the thin film transistor substrate; a pixel electrode connected to one end of the thin film transistor and one end of the light emitting element; a common electrode on the thin film transistor substrate and connected to an other end of the light emitting element; a color conversion layer on the light emitting element and including a plurality of quantum dot materials; and an encapsulation layer on the color conversion layer.

In some embodiments, the pixel electrode and the common electrode are between the thin film transistor substrate and the light emitting element, and are at different layers.

In some embodiments, the display device further includes a first passivation film overlapping the thin film transistor, and a second passivation film on the first passivation film, wherein the common electrode is on the first passivation film, and the pixel electrode is on the second passivation film.

In some embodiments, the pixel electrode and the common electrode are under the light emitting element and are at a same layer.

In some embodiments, the display device further includes a passivation film overlapping the thin film transistor, wherein the pixel electrode and the common electrode are on the passivation film.

In some embodiments, the pixel electrode is between the thin film transistor substrate and the light emitting element, and the common electrode is on the light emitting element.

In some embodiments, the display device further includes a pixel defining layer on the thin film transistor substrate and a light blocking layer on the pixel defining layer.

In some embodiments, the display device further includes a pixel defining layer on the thin film transistor substrate, wherein the pixel defining layer includes a light blocking material.

In some embodiments, the display device further includes a blue light blocking layer, wherein the blue light blocking layer is on the color conversion layer.

In some embodiments, the display device further includes a blue light blocking layer, wherein the blue light blocking layer is between the light emitting element and the color conversion layer.

In some embodiments, the light emitting element is configured to emit blue light.

According to some embodiments of the present invention, there is provided a display device including: a thin film transistor substrate including a red pixel unit, a green pixel unit and a blue pixel unit, each having at least one thin film transistor; a light emitting element including ultra-small LED elements on the red pixel unit, the green pixel unit, and the blue pixel unit, which are on the thin film transistor substrate; a pixel electrode and a common electrode in the red pixel unit, the green pixel unit, and the blue pixel unit, and connected to the light emitting element; a red color conversion layer including a plurality of quantum dot materials and located on the light emitting element in the red pixel unit; a green color conversion layer including a plurality of quantum dot materials and located on the light emitting element in the green pixel unit; a light transmission layer on the light emitting element in the blue pixel unit; and an encapsulation layer on the red pixel unit, the green pixel unit and the blue pixel unit.

In some embodiments, the light transmission layer is configured to transmit blue light.

In some embodiments, the pixel electrode and the common electrode are between the thin film transistor substrate and the light emitting element, and are at different layers.

In some embodiments, the display device further includes a first passivation film on the thin film transistor substrate, and a second passivation film on the first passivation film, wherein the common electrode is on the first passivation film, and the pixel electrode is on the second passivation film.

In some embodiments, the display device further includes a pixel defining layer between the red pixel unit, the green pixel unit, and the blue pixel unit, and a light blocking layer on the pixel defining layer.

In some embodiments, the display device further includes a pixel defining layer between the red pixel unit, the green pixel unit and the blue pixel unit, wherein the pixel defining layer includes a light blocking material.

In some embodiments, the display device further includes a blue light blocking layer in the red pixel unit and the green pixel unit, wherein the blue light blocking layer is on the red color conversion layer and the green color conversion layer.

In some embodiments, the display device further includes a blue light blocking layer in the red pixel unit and the green pixel unit, wherein the blue light blocking layer is between the light emitting element and the red color conversion layer, and between the light emitting element and the green color conversion layer.

In some embodiments, the light emitting element is configured to emit blue light.

DETAILED DESCRIPTION

While embodiments are described with reference to the accompanying drawings, it is to be understood that various suitable changes and modifications may be made in the disclosure. Further, it should be understood that the disclosure is not limited to the specific embodiments thereof, and various changes, equivalents and substitutions may be made without departing from the scope and spirit of the disclosure.

In the following detailed description, reference numerals refer to like elements throughout. In the drawings, size of one or more elements of the illustrated structure may be exaggerated for clarification purposes. Expression of the singular may include the expression of the plural unless it is explicitly different in context.

Hereinafter, example embodiments of the present invention will be described in detail with reference to the drawings.

Figure 1:
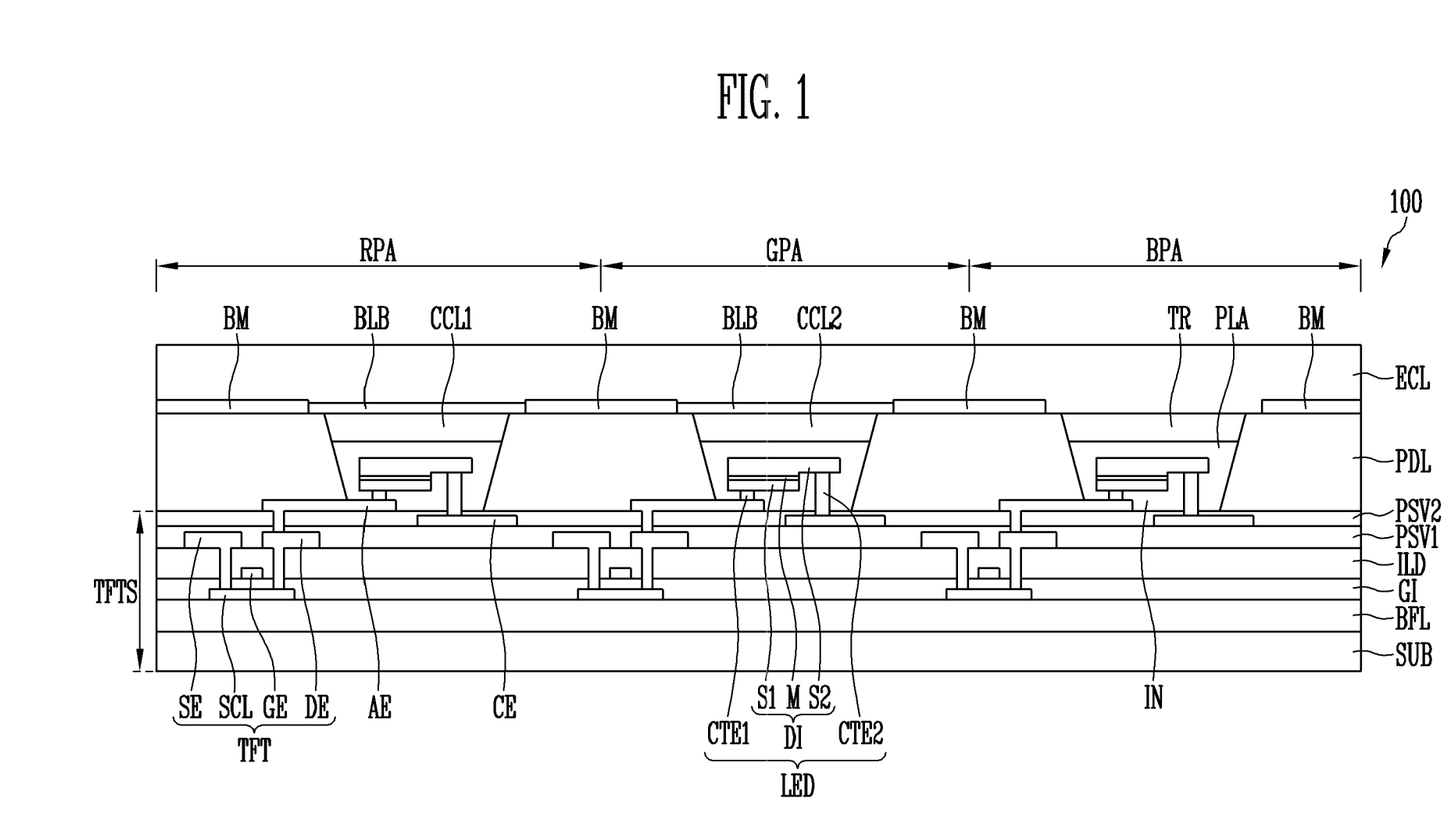
FIGS. 1-2 are cross-sectional views of a display device according to an embodiment of the present invention in which a pixel electrode and a common electrode are disposed between a thin film transistor substrate and a light emitting element, and disposed in different layers.
Figure 2:
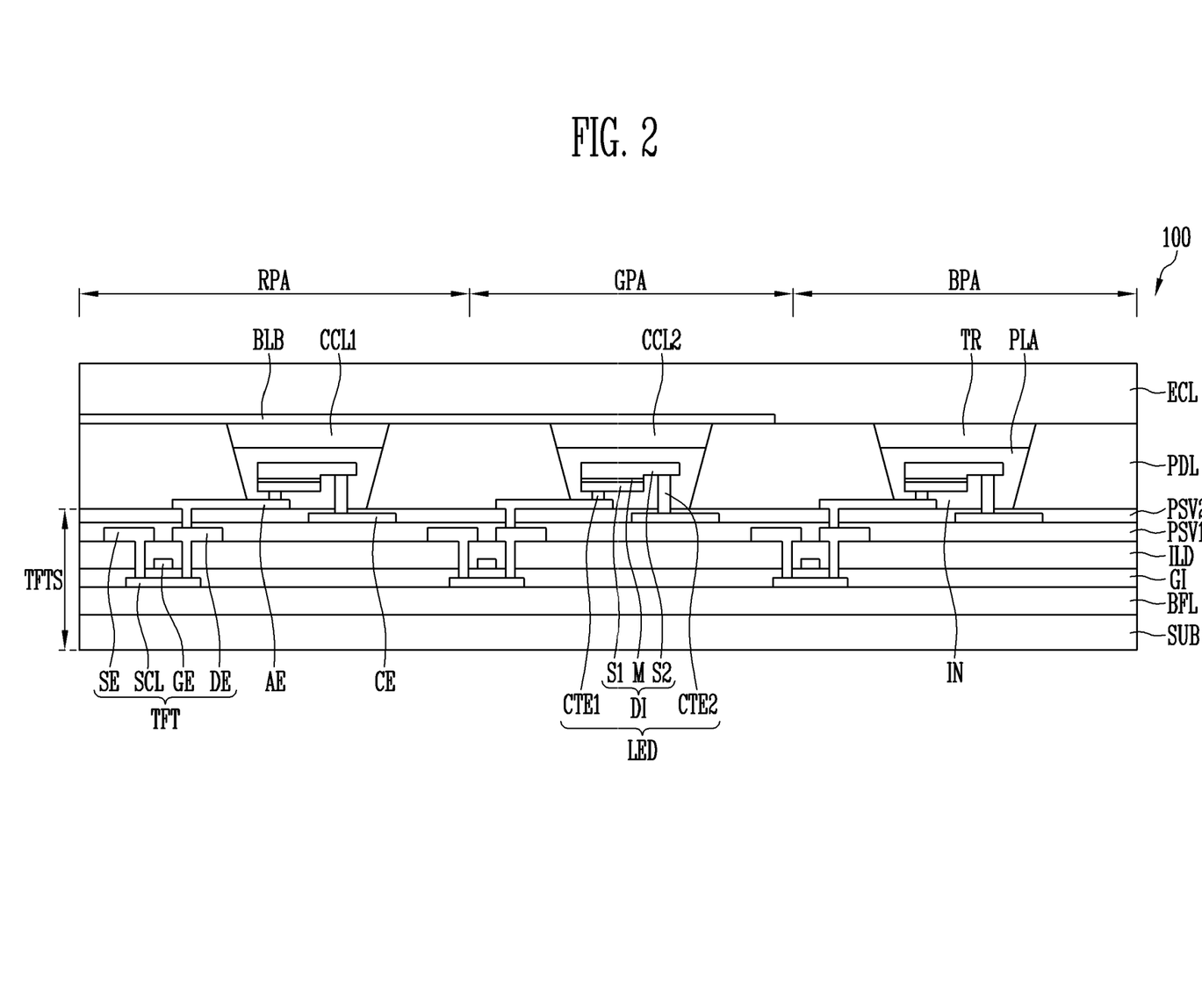

FIGS. 1 and 2 are cross-sectional views of a display device according to an embodiment of the present invention in which a pixel electrode and a common electrode are disposed between a thin film transistor substrate and a light emitting element, and disposed in different layers.

Referring to FIGS. 1 and 2, the display device may include a thin film transistor substrate TFTS, a light emitting element LED disposed on the thin film transistor substrate TFTS, a pixel defining layer PDL, color conversion layers CCL1, CCL2, a light transmission layer TR, a blue light blocking layer BLB, and an encapsulation layer ECL.

The thin film transistor substrate TFTS may include a base substrate SUB, a buffer layer BFL on the base substrate SUB, and at least one thin film transistor TFT disposed on the buffer layer BFL.

The base substrate SUB may include a transparent insulating material to transmit light.

The base substrate SUB may be a flexible substrate. The flexible substrate may include a film substrate including a polymeric organic material and a plastic substrate. For example, the flexible substrate may be made of a material selected from the group consisting of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC) and cellulose acetate propionate (CAP). In addition, the flexible substrate may include fiber glass reinforced plastic (FRP).

The base substrate SUB may be a rigid substrate. The rigid substrate may be one of a glass substrate, a quartz substrate, a glass ceramic substrate, and a crystalline glass substrate.

According to some embodiments, the material to be applied to the base substrate SUB may have resistance against a high processing temperature (or heat resistance) in the manufacturing process of the display device.

The buffer layer BFL may be disposed between the base substrate SUB and the thin film transistor TFT. The buffer layer BFL may include an inorganic insulating material. For example, the buffer layer BFL may include silicon oxide ($SiO_x$), silicon nitride ($SiN_x$), silicon oxynitride (SiON), and/or the like.

Further, the buffer layer BFL may have a single-film structure or a multi-film structure. For example, the buffer layer BFL may have a single-film structure including silicon oxide, silicon nitride, silicon oxynitride, and/or the like. The buffer layer BFL may include a silicon oxide film, and a silicon nitride film disposed on the silicon oxide film. The buffer layer BFL may include three or more insulating films, which are stacked sequentially.

The buffer layer BFL may prevent or substantially prevent impurities from diffusing from the substrate SUB to the thin film transistor TFT. The buffer layer BFL may also planarize the surface of the substrate SUB.

The thin film transistor TFT may be connected to a gate line and a data line. The thin film transistor TFT may include a semiconductor layer SCL, a gate electrode GE, a source electrode SE and a drain electrode DE.

The semiconductor layer SCL may be disposed on the buffer layer BFL. The semiconductor layer SCL may include amorphous Si, poly crystalline Si, an oxide semiconductor, an organic semiconductor, and/or the like. In the semiconductor layer SCL, a region connected to the source electrode SE and the drain electrode DE may respectively be a source region and a drain region, which are doped or implanted with impurities. A region between the source region and the drain region may be a channel region.

When the semiconductor layer SCL includes an oxide semiconductor, a light blocking film may be disposed for blocking light entering from the upper portion or the lower portion of the semiconductor layer SCL to the semiconductor layer SCL.

A gate insulating film GI may be disposed on the semiconductor layer SCL. The gate insulating film GI may cover the semiconductor layer SCL and insulate the semiconductor layer SCL and the gate electrode GE. The gate insulating film GI may include at least one of an organic insulating material and an inorganic insulating material. For example, the gate insulating film GI may include silicon oxide, silicon nitride, and/or the like.

The gate electrode GE may be disposed on the gate insulating film GI. The gate electrode GE may be connected to the gate line. The gate electrode GE may include a low-resistance conductive material and may overlap the semiconductor layer SCL.

An interlayer insulating film ILD may be disposed on the gate electrode GE. The interlayer insulating film ILD may include at least one of an organic insulating material and an inorganic insulating material. For example, the interlayer insulating film ILD may include silicon oxide, silicon nitride, and/or the like. The interlayer insulating film ILD may isolate the source electrode SE, the drain electrode DE and the gate electrode GE from each other.

Contact holes (or contact openings) passing through the gate insulating film GI and the interlayer insulating film ILD may expose the source region and the drain region of the semiconductor layer SCL.

The source electrode SE and the drain electrode DE may be disposed apart from each other on the interlayer insulating film ILD. The source electrode SE and the drain electrode DE may include a low-resistance conductive material. One end of the source electrode SE may be connected to the data line. The other end of the source electrode SE may be connected to the source region through one of the contact holes. One end of the drain electrode DE may be connected to the drain region through the other one of the contact holes. The other end of the drain electrode DE may be connected to the light emitting element LED.

Meanwhile, in the present embodiment, the case where the thin film transistor TFT is a thin film transistor having a top gate structure is described as an example, but the present invention is not limited thereto. For example, the thin film transistor TFT may be a thin film transistor having a bottom gate structure.

The thin film transistor substrate TFTS may further include a passivation film PSV disposed on the thin film transistor TFT. The passivation film PSV may cover the thin film transistor TFT. A portion of the passivation film PSV may be removed to expose one of the source electrode SE and the drain electrode DE, for example, the drain electrode DE.

The passivation film PSV may include at least one film. For example, the passivation film PSV may include a first passivation film PSV1 and a second passivation film PSV2. For example, the first passivation film PSV1 may cover the thin film transistor TFT, and the second passivation film may be disposed on the first passivation film PSV1.

The first passivation film PSV1 may include an inorganic passivation film and an organic passivation film disposed on the inorganic passivation film. The inorganic passivation film may include silicon oxide, silicon nitride, silicon oxynitride, and/or the like. The organic passivation film may include acryl, polyimide (PI), polyamide (PA), benzocyclobutene (BCB), and/or the like. In addition, the organic passivation film may be a planarizing film that is transparent and has sufficient fluidity to flatten the unevenness of the underlying structure.

The second passivation film PSV2 may include an inorganic insulating material. For example, the second passivation film PSV2 may include silicon oxide, silicon nitride, silicon oxynitride, and/or the like.

The thin film transistor substrate TFTS may include a red pixel unit RPA, a green pixel unit GPA, and a blue pixel unit BPA.

The light emitting element LED may be disposed on the thin film transistor substrate TFTS, for example, on each of the red pixel unit RPA, the green pixel unit GPA, and the blue pixel unit BPA on the thin film transistor substrate TFTS. The light emitting element LED may include an ultra-small light emitting diode (LED) element, for example, an ultra-small LED element emitting blue light.

The ultra-small LED element may be an LED element of micrometer or nanometer size.

The light emitting element LED may be disposed between a first contact electrode CTE1 electrically connected to the pixel electrode AE, and a second contact electrode CTE2 electrically connected to the common electrode CE. The light emitting element LED may include a p-n diode DI, which includes a first semiconductor layer S1 connected to the first contact electrode CTE1, a second semiconductor layer S2 connected to the second contact electrode CTE2, and an intermediate layer M. That is, one end of the light emitting element LED may be electrically connected to the pixel electrode AE, and the other end may be electrically connected to the common electrode CE.

The first semiconductor layer S1 may be, for example, a p-type semiconductor layer. The p-type semiconductor layer may include a material such as GaN, AlN, AlGaN, InGaN, InN, InAlGaN, AlInN, and/or the like, and may be doped with a p-type dopant, such as Mg, Zn, Ca, Sr, Ba, and/or the like, but is not limited thereto. The second semiconductor layer S2 may be, for example, an n-type semiconductor layer. The n-type semiconductor layer may include a material such as GaN, AlN, AlGaN, InGaN, InN, InAlGaN, AlInN, and/or the like, and may be doped with an n-type dopant, such as Si, Ge, Sn, and/or the like, but is not limited thereto. However, the first semiconductor layer may be an n-type semiconductor layer and the second semiconductor layer may be a p-type semiconductor layer.

The intermediate layer M is a region where electrons and holes are recombined. As the electrons and the holes recombine, the intermediate layer M transitions to a low energy level and may generate light having a wavelength corresponding thereto. The intermediate layer may be formed of a single quantum well structure or a multi quantum well (MQW) structure. The intermediate layer may also include a quantum wire structure or a quantum dot structure.

The first contact electrode CTE1 and the second contact electrode CTE2 may be disposed on the same surface of the light emitting element LED, specifically, the diode DI. The first semiconductor layer S1 and the intermediate layer M may be partially removed to expose a portion of the second semiconductor layer S2, and the second contact electrode CTE2 may be disposed on the exposed second semiconductor layer S2. That is, the area of the second semiconductor layer S2 may be larger than the area of the first semiconductor layer S1 or the intermediate layer M, and the second contact electrode CTE2 may be disposed on the second semiconductor layer S2, which protrudes outside of the first semiconductor layer S1 and the intermediate layer M.

The light emitting element LED may further include an insulating layer provided at a remaining portion except a portion in contact with the pixel electrode AE and the common electrode CE. The insulating layer may be an insulating coating, which surrounds the light emitting element LED.

An insulator IN may be disposed in a space defined between the second passivation film PSV2, the pixel electrode AE, the rear surface of the first semiconductor layer S1, the first contact electrode CTE1, and the second contact electrode CTE2. The insulator IN may prevent a short or reduce instances of a short, which may be caused by a foreign matter due to the short distance between the first and second contact electrodes CTE1 and CTE2.

However, the structure of the light emitting element LED is not limited to the above. When the first contact electrode CTE1 and the second contact electrode CTE2 contact the pixel electrode AE and the common electrode CE, respectively, the light emitting element LED having a structure in which the first contact electrode CTE1 and the second contact electrode CTE2 are present on both sides of the light emitting element LED may also be utilized.

The light emitting element LED may be connected to the pixel electrode AE and the common electrode CE, which are disposed on the thin film transistor substrate TFTS, for example, in each of the red pixel unit RPA, the green pixel unit GPA and the blue pixel unit BPA on the thin film transistor substrate TFTS. One of the pixel electrode AE and the common electrode CE may be an anode electrode, and the other may be a cathode electrode. For example, the pixel electrode AE may be an anode electrode, and the common electrode CE may be a cathode electrode. However, the pixel electrode AE and the common electrode CE are interchangeable.

The pixel electrode AE and the common electrode CE may be disposed between the thin film transistor substrate TFTS and the light emitting element LED, and disposed on different layers. For example, the common electrode CE may be disposed on the first passivation film PSV1, and the pixel electrode AE may be disposed on the second passivation film PSV2. Conversely, the pixel electrode AE may be disposed on the first passivation film PSV1, and the common electrode CE may be disposed on the second passivation film PSV2.

The pixel electrode AE and the common electrode CE may be formed of at least one selected from the group consisting of silver (Ag), magnesium (Mg), aluminum (Al), platinum (Pt), palladium (Pd), gold (Au), nickel (Ni), neodymium (Nd), iridium (Ir), chromium (Cr), copper (Cu), zinc (Zn), silicon (Si), and compounds thereof. The pixel electrode AE and the common electrode CE may be formed of the same conductive material or different conductive materials.

A pixel defining layer PDL may be disposed on the thin film transistor substrate TFTS. The pixel defining layer PDL may be disposed between adjacent pixel regions. For example, the pixel defining layer PDL may be disposed between the red pixel unit RPA and the green pixel unit GPA, between the red pixel unit RPA and the blue pixel unit BPA, or between the green pixel unit GPA and the blue pixel unit GPA. The pixel defining layer PDL may expose at least a portion of the pixel electrode AE. In addition, the pixel defining layer PDL may overlap the edge portion of the pixel electrode AE. Therefore, the pixel defining layer PDL may expose most of the surface facing the encapsulation layer ECL of the pixel electrode AE.

The pixel defining layer PDL may include an organic insulating material. For example, the pixel defining layer PDL may be formed of at least one selected from the group consisting of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

On the other hand, as shown in FIG. 1, a light blocking layer BM may be further included on the pixel defining layer PDL. The light blocking layer BM may be made of a photosensitive composition. For example, the photosensitive composition may include a binder resin, a polymeric monomer, a polymeric oligomer, a dispersant, a pigment, and a photo initiator. A black pigment or a black resin may be used as the pigment. In some examples, as shown in FIG. 2, the pixel defining layer PDL may include the photosensitive compositions listed above as the light blocking material.

The color conversion layers CCL1 and CCL2 may convert incident light into light of different colors. The color conversion layers CCL1 and CCL2 may be disposed on the light emitting element LED, and a blue light blocking layer BLB may be disposed on or under the color conversion layers CCL1 and CCL2.

The color conversion layers CCL1 and CCL2 may include a red color conversion layer CCL1 disposed on the light emitting element LED in the red pixel unit RPA, and a green color conversion layer CCL2 disposed on the light emitting element LED in the green pixel unit GPA. Correspondingly, a light transmission layer TR may be disposed on the light emitting element LED in the blue pixel unit BPA. For example, when blue light emitted from the light emitting element LED is incident on the color conversion layers CCL1 and CCL2 and the light transmission layer TR, red light and green light may be emitted from the red pixel unit RPA and the green pixel unit, respectively.

The red color conversion layer CCL1 and the green color conversion layer CCL2 may include a plurality of quantum dot materials. For example, the red pixel unit RPA may be provided with the red color conversion layer CCL1 having a plurality of quantum dots that absorb incident light, that is, blue light, and convert the light into, and emit, red light. In addition, the green pixel unit GPA may be provided with the green color conversion layer CCL2 having a plurality of quantum dots which absorb incident light, that is, blue light, and convert the blue light into, and emit, green light.

The quantum dots provided in the color conversion layers CCL1 and CCL2 may include silicon (Si) based nanocrystals, II-VI group compound semiconductor nanocrystals, III-V group compound semiconductor nanocrystals, IV-VI group compound semiconductor nanocrystals, and nanocrystals of mixtures thereof. The II-VI group compound semiconductor nanocrystals may be any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The III-V group compound semiconductor nanocrystals may be any one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI group compound semiconductor nanocrystals may, for example, be SbTe.

Even though the quantum dots provided in the color conversion layers CCL1 and CCL2 are made of the same material, the emission wavelength may vary depending on the size of the quantum dots. As the size of the quantum dots decreases, wavelength of light emitted becomes shorter. Therefore, it is possible to emit light in a desired visible light region by adjusting the size of quantum dots provided in the color conversion layers CCL1 and CCL2.

The light transmission layer TR may transmit blue light emitted from the light emitting element LED. That is, blue light may be emitted from the blue pixel unit BPA. In addition, the light transmission layer TR may include a transparent resin or scattering particles dispersed in a transparent resin.

The scattering particles may include titanium oxide ($TiO_2$). However, the material of the scattering particles is not limited thereto, and may be variously modified, as suitable, if the material scatters blue light without color conversion.

The blue light blocking layer BLB may be disposed on the color conversion layers CCL1 and CCL2 in the red pixel unit RPA and the green pixel unit GPA. The blue light blocking layer BLB may block the unconverted blue light from being emitted from the color conversion layers CCL1 and CCL2. The blue light blocking layer BLB exhibits low transmittance to blue light and high transmittance to visible light.

The blue light blocking layer BLB may have a structure in which a plurality of layers having different refractive indecesare alternately laminated.

As the blue light blocking layer BLB may selectively transmit light emitted from the inside, the color reproducibility of the color conversion layers CCL1 and CCL2 and the blue light blocking layer BLB according to the present invention may be improved.

The blue light blocking layer BLB may be disposed on the color conversion layers CCL1 and CCL2 or between the light emitting element LED and the color conversion layers CCL1 and CCL2. However, the position where the blue light blocking layer BLB is disposed is not limited to the above, particularly when light, which is emitted from the light emitting element LED and is not converted, can be blocked by the color conversion layers CCL1 and CCL2.

The encapsulation layer ECL may be disposed on the color conversion layers CCL1 and CCL2, the light transmission layer TR and the pixel defining layer PDL. The encapsulation layer ECL may cover the light emitting element LED and the color conversion layers CCL1 and CCL2 on the light emitting element LED to prevent oxygen and moisture from penetrating into the light emitting element LED, the color conversion layers CCL1 and CCL2, the light transmission layer TR, and the blue light blocking layer BLB.

In addition, the encapsulation layer ECL may include a plurality of insulating films. For example, the encapsulation layer ECL may include at least one inorganic film and at least one organic film. For example, the encapsulation layer ECL may include a first inorganic film on the common electrode CE, an organic film on the first inorganic film, and a second inorganic film on the organic film. The inorganic film may include silicon oxide, silicon nitride, silicon oxynitride, aluminum oxide, titanium oxide, zirconium oxide, tin oxide, and/or the like. The organic film may include acryl, polyimide (PI), polyamide (PA), benzocyclobutene (BCB), and/or the like.

Figure 3:
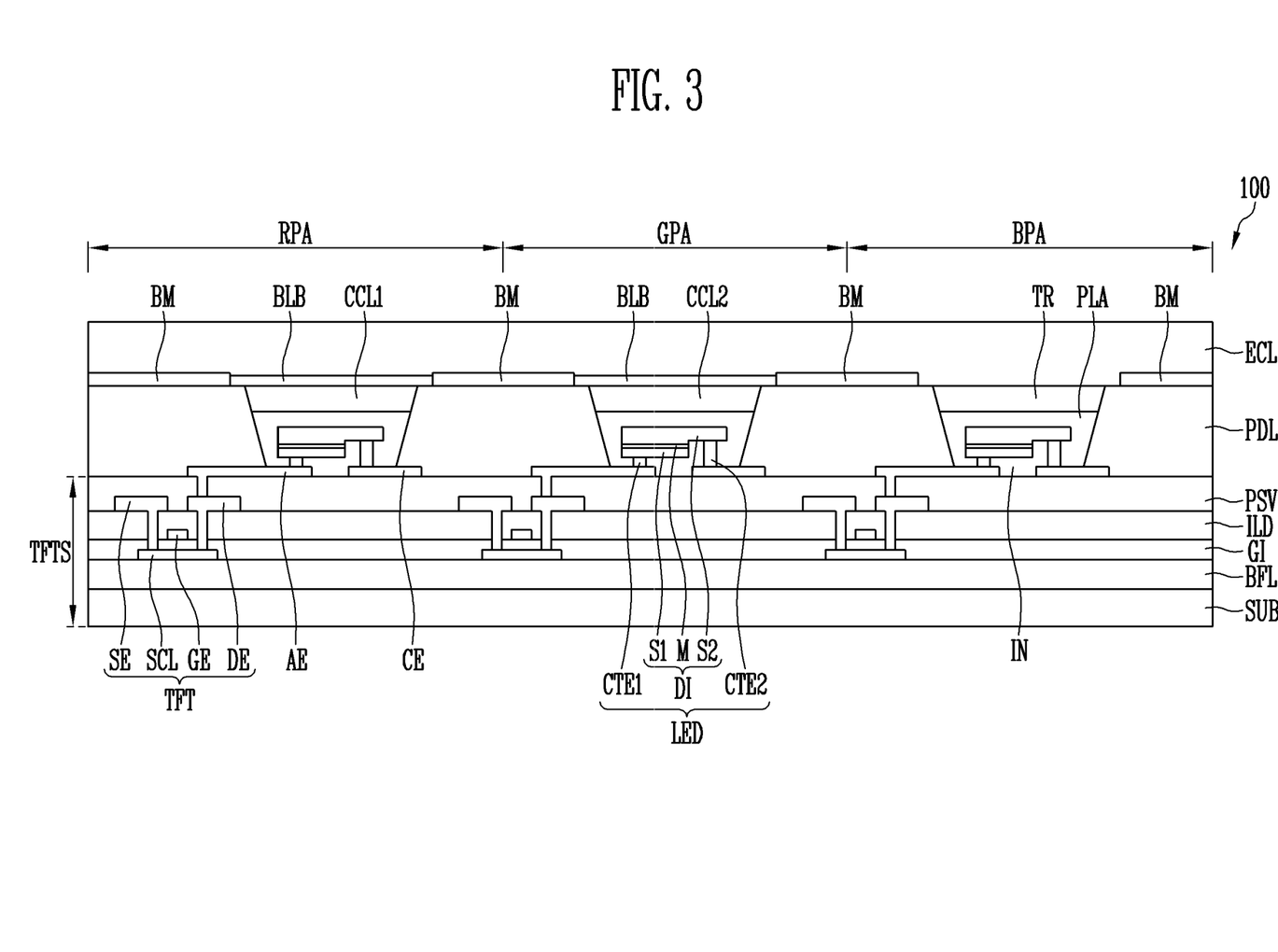
FIGS. 3-4 are cross-sectional views of a display device according to an embodiment of the present invention in which a pixel electrode and a common electrode are disposed between a thin film transistor substrate and a light emitting element, and disposed on the same layer.
Figure 4:
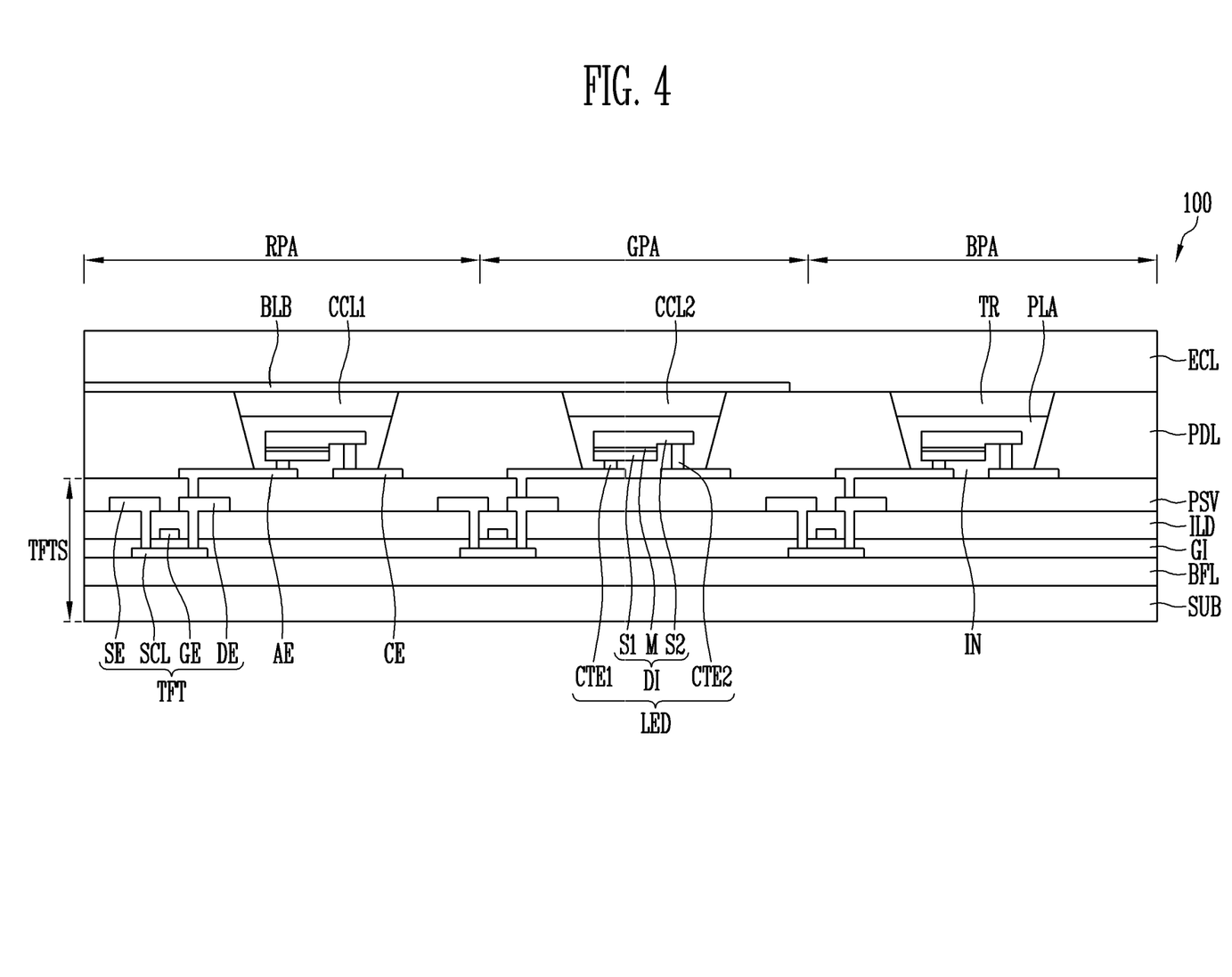

FIGS. 3 and 4 are cross-sectional views of a display device according to an embodiment of the present invention in which a pixel electrode and a common electrode are disposed between a thin film transistor substrate and a light emitting element, and disposed on the same layer.

Referring to FIGS. 3 and 4, the display device may include the thin film transistor substrate TFTS, the light emitting element LED disposed on the thin film transistor substrate TFTS, the pixel electrode AE and the common electrode CE disposed on the thin film transistor substrate TFTS and connected to the light emitting element LED, the pixel defining layer PDL, the color conversion layers CCL1 and CCL2, the light transmission layer TR, the blue light blocking layer BLB, and the encapsulation layer ECL.

Hereinafter, the present embodiment will be mainly described with reference to the differences from the previous embodiment, and the description of similarities may not be repeated.

The pixel electrode AE and the common electrode CE may be disposed under the light emitting element LED, and may be disposed on the same layer. For example, when the display device 100 includes the passivation film PSV, the pixel electrode AE and the common electrode CE may be disposed on the passivation film PSV.

The pixel defining layer PDL may be disposed on the thin film transistor substrate TFTS. As shown in FIG. 3, the light blocking layer BM may be further disposed on the pixel defining layer PDL. However, as shown in FIG. 4, in some embodiments, the pixel defining layer PDL may include a light blocking material as a photosensitive composition.

Figure 5:
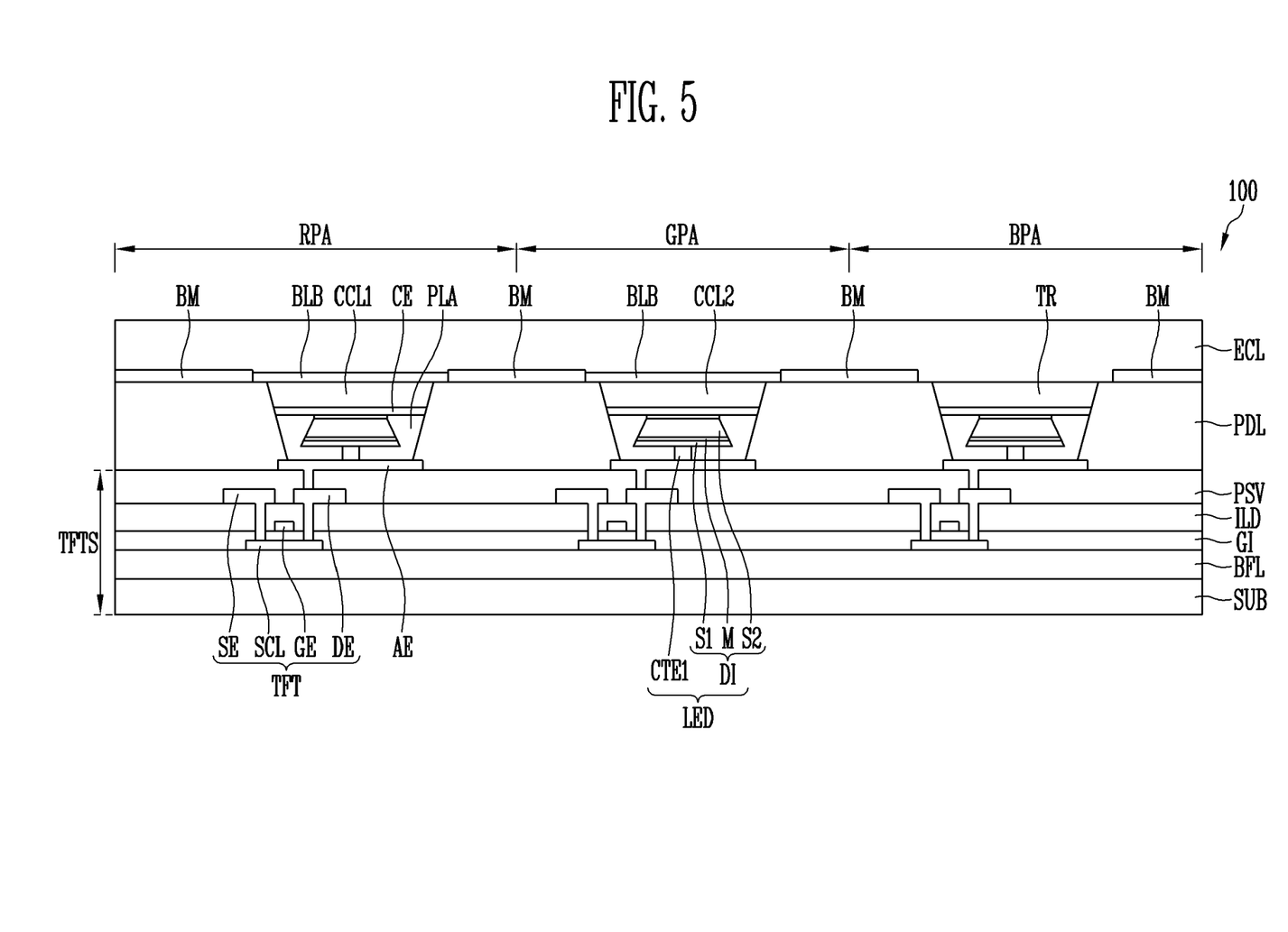
FIGS. 5 and 7 are cross-sectional views of a display device according to an embodiment of the present invention in which a pixel electrode is disposed between a thin film transistor substrate and a light emitting element, a common electrode is disposed on the light emitting element, and a blue light blocking layer is disposed on a color conversion layer.
Figure 7:
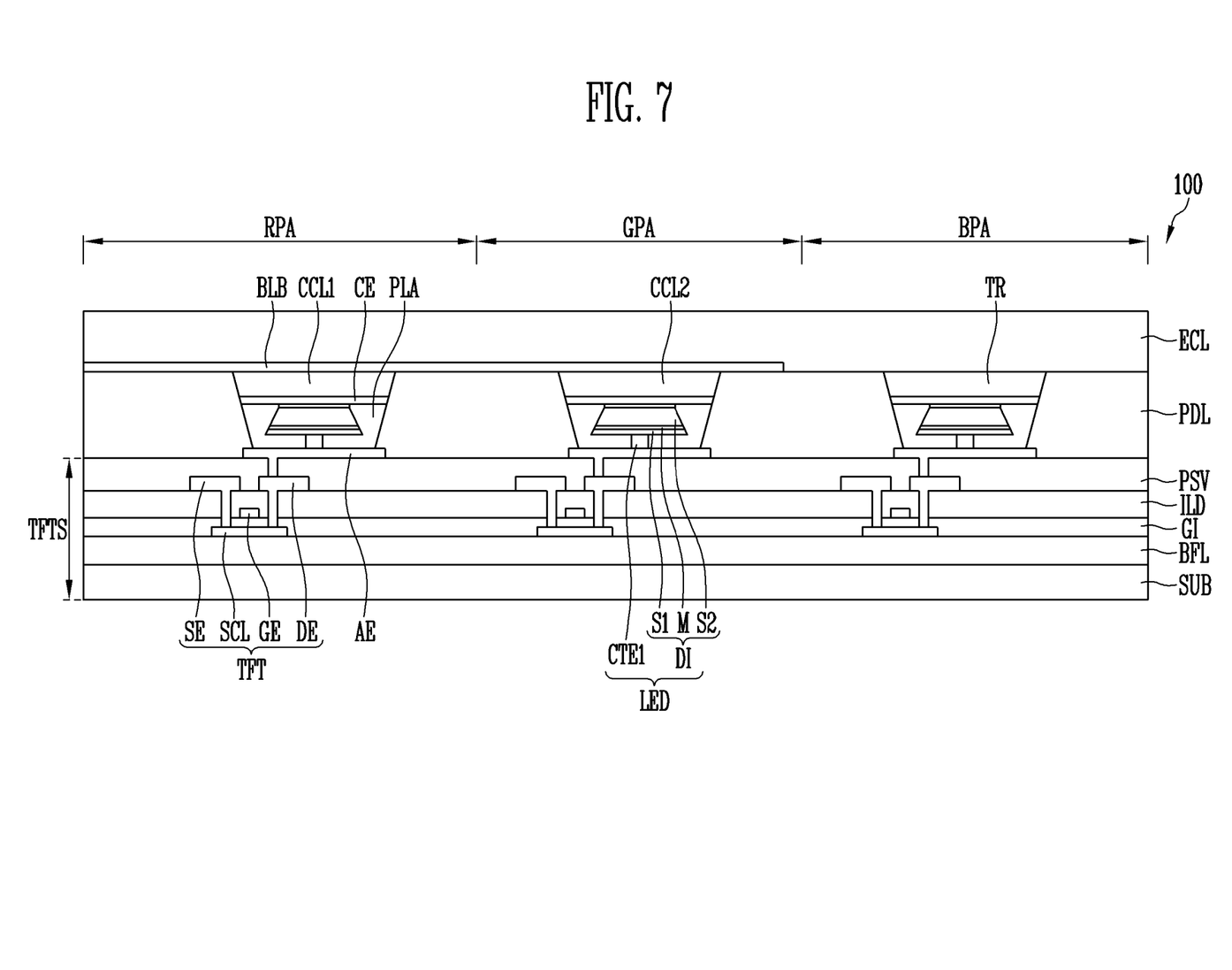

FIGS. 5 and 7 are cross-sectional views of a display device according to an embodiment of the present invention in which a pixel electrode is disposed between a thin film transistor substrate and a light emitting element, a common electrode is disposed on the light emitting element, and a blue light blocking layer is disposed on a color conversion layer.

Figure 6:
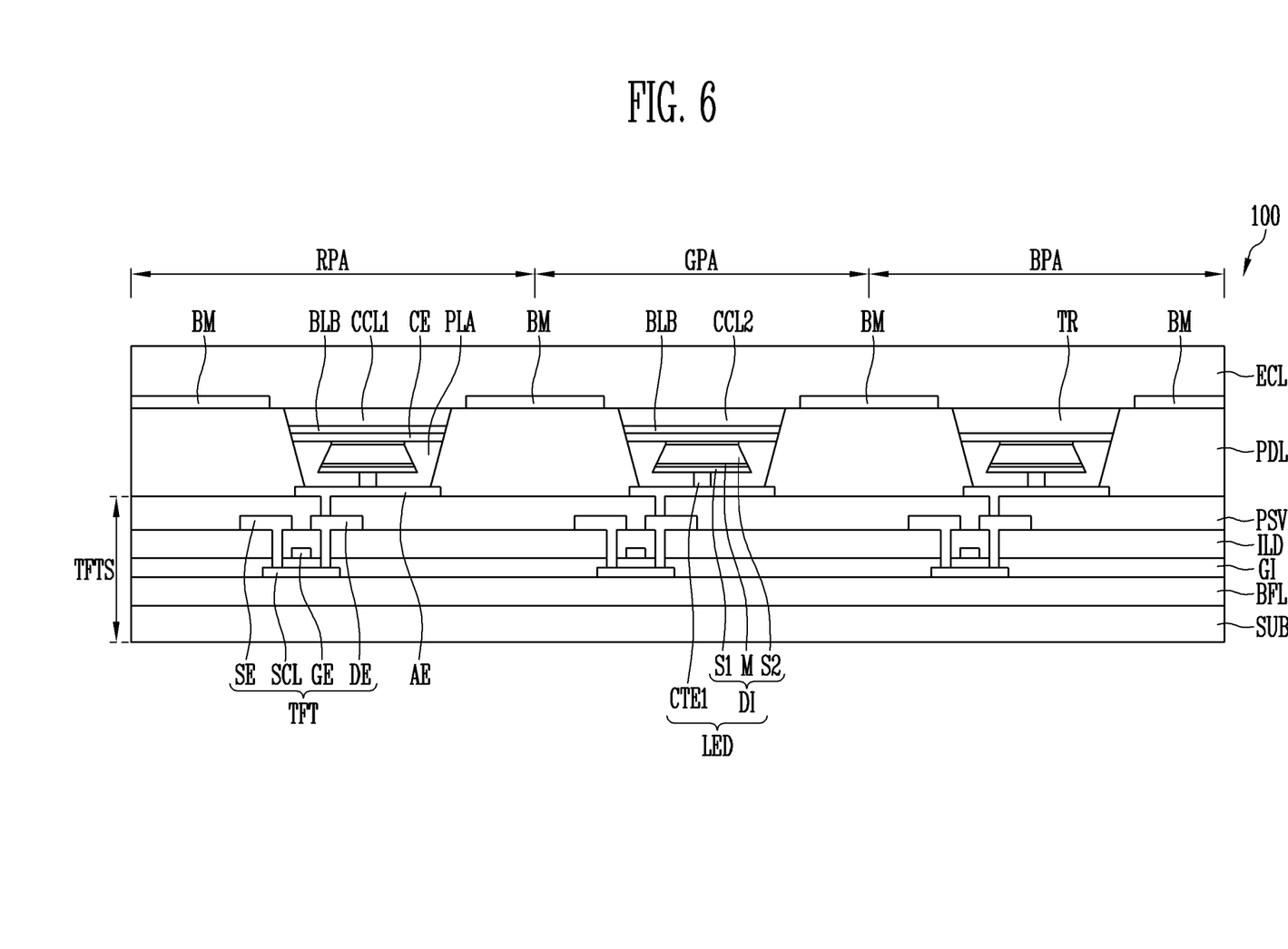
FIGS. 6 and 8 illustrate cross-sectional views of a display device according to an embodiment of the present invention in which a pixel electrode is disposed between a thin film transistor substrate and a light emitting element, a common electrode is disposed on the light emitting element, and a blue light blocking layer is disposed on the common electrode.
Figure 8:
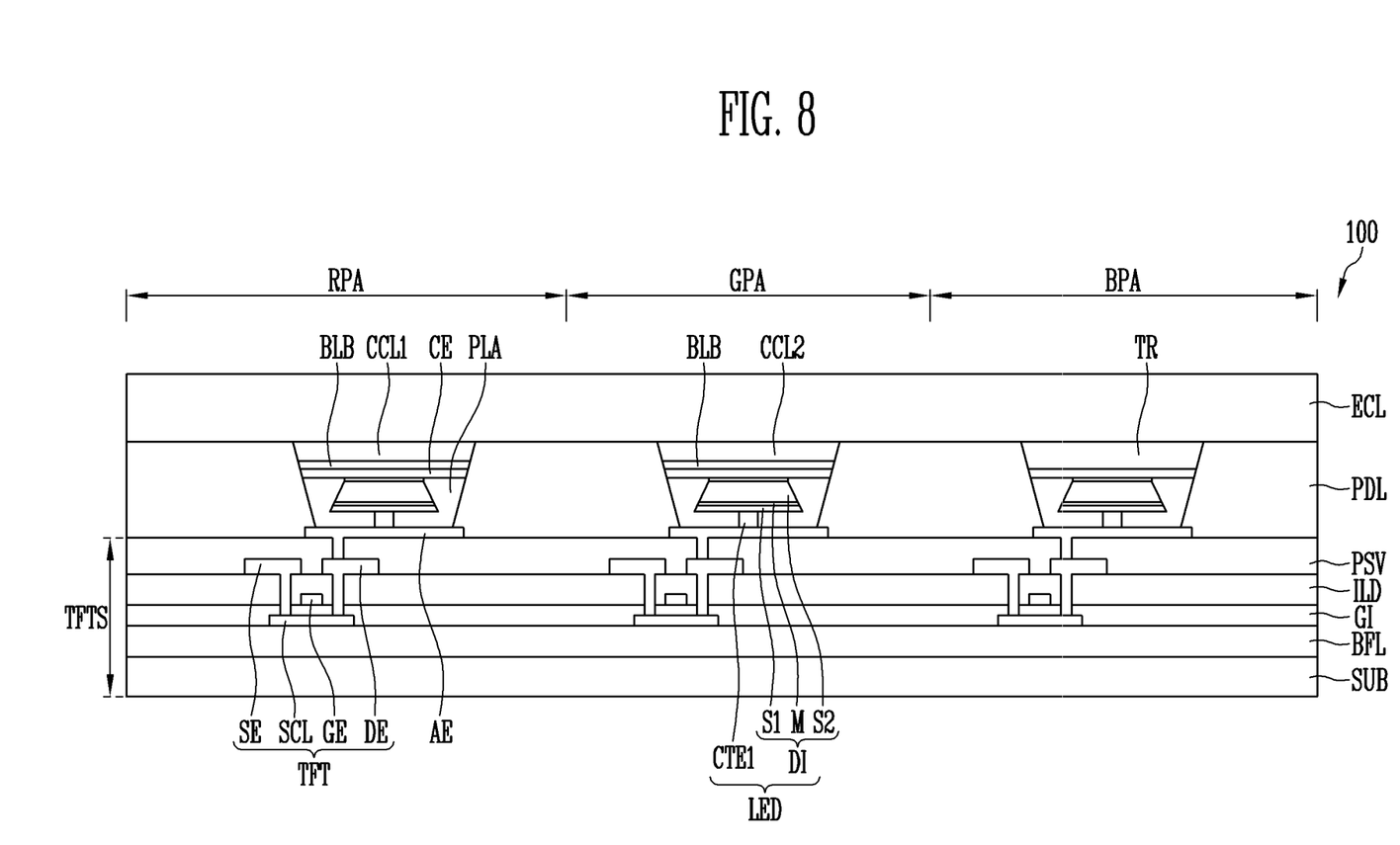

FIGS. 6 and 8 are cross-sectional views of a display device according to an embodiment of the present invention in which a pixel electrode is disposed between a thin film transistor substrate and a light emitting element, a common electrode is disposed on the light emitting element, and a blue light blocking layer is disposed on the common electrode.

Referring to FIGS. 5 to 8, the display device may include the thin film transistor substrate TFTS, the light emitting element LED disposed on the thin film transistor substrate TFTS, the pixel electrode AE and the common electrode CE disposed on the thin film transistor substrate TFTS and connected to the light emitting element LED, the pixel defining layer PDL, the color conversion layers CCL1 and CCL2, the light transmission layer TR, the blue light blocking layer BLB and the encapsulation layer ECL.

Hereinafter, the present embodiment will be mainly described with respect to the differences from the previous embodiment, and the description of similarities may not be repeated.

The pixel electrode AE may be disposed between the thin film transistor substrate TFTS and the light emitting element LED, and the common electrode CE may be disposed on the light emitting element LED.

The light emitting element LED may include the p-n diode DI, which includes the first contact electrode CTE1 electrically connected to the pixel electrode AE, the first semiconductor layer S1 disposed on the first contact electrode CTE1, the intermediate layer M disposed on the first semiconductor layer S1, and the second semiconductor layer S2 disposed on the intermediate layer M. The second semiconductor layer S2 of the light emitting element LED may be in contact with the common electrode CE without a separate contact electrode, but a second contact electrode may be added, when desired.

A planarizing film PLA may be provided outside of the light emitting element LED, and the common electrode CE may be disposed on the light emitting element LED and the planarizing film PLA.

The pixel defining layer PDL may be disposed on the thin film transistor substrate TFTS. On the other hand, as shown in FIGS. 5 and 6, the light blocking layer BM may be further disposed on the pixel defining layer PDL. However, as shown in FIGS. 7 and 8, in some embodiments, the pixel defining layer PDL may include the above-described photosensitive composition as a light shielding material.

As shown in FIGS. 5 and 7, a blue light blocking layer BLB may be disposed on the color conversion layers CCL1 and CCL2. However, as shown in FIGS. 6 and 8, in some embodiments, the blue light blocking layer BLB may be disposed between the light emitting element LED and the color conversion layers CCL1 and CCL2.

A display device according to an embodiment of the present invention may include color conversion layers including a quantum dot material and a blue light blocking layer to improve color reproducibility and a color viewing angle.

While the present disclosure has been particularly shown and described with reference to exemplary embodiments thereof, it is to be understood that the disclosure is not limited to the disclosed exemplary embodiments but the present disclosure may be variously modified and changed, as suitable, without departing from the claim scope.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present. In addition, when parts of layers, films, regions and substrates are "on" one another and the like, the formed direction is not limited to an upper direction but includes a side direction or a downward direction. In contrast, when parts of layers, films, regions and substrates are "under" one another and the like, it includes not only the case where the other part is "directly under" but also the case where there is another part in the middle.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Therefore, the technical scope of the present disclosure should not be limited to the contents described in the detailed description of the specification, but should be defined by the scope of claims, and equivalents thereof.

What is claimed is:

1. A display device comprising:
   a thin film transistor substrate comprising a thin film transistor;
   light emitting elements on the thin film transistor substrate and comprising a first light emitting element and a second light emitting element;
   a pixel electrode connected to one end of the thin film transistor and electrically connected to one end of the first or the second light emitting elements via a first contact electrode;
   a common electrode on the thin film transistor substrate and electrically connected to an other end of one of the first or second light emitting elements via a second contact electrode;
   a pixel defining layer including an opening at least partially exposing the one of the first or second light emitting elements;
   an insulator on the one of the first or second light emitting elements in the opening of the pixel defining layer;
   a color conversion layer comprising a red color conversion layer on the first light emitting element and a green color conversion layer on the second light emitting element, the red color conversion layer comprising a plurality of quantum dot materials, and the green color conversion layer comprising a plurality of quantum dot materials; and
   a light blocking layer on the red and green color conversion layers,
   wherein the color conversion layer is directly on the insulator,
   wherein the first and second contact electrodes contact a bottom surface of the one of the first or second light emitting elements facing away from the color conversion layer, and wherein the insulator contacts a top surface and the bottom surface of the one of the first or second light emitting elements.

2. The display device as claimed in claim 1, wherein a height of a top surface of the red color conversion layer or a height of a top surface of the green color conversion layer is substantially equal to a height of a top surface of the pixel defining layer.

3. The display device as claimed in claim 1, wherein the insulator covers a side surface and a top surface of the one of the first or second light emitting elements.

4. The display device as claimed in claim 1, wherein the pixel electrode and the common electrode are under the one of the first or second light emitting elements and are at a same layer.

5. The display device as claimed in claim 4, further comprising a passivation film overlapping the thin film transistor,
wherein the pixel electrode and the common electrode are on the passivation film.

6. The display device as claimed in claim 1, wherein the pixel defining layer comprises a light blocking material.

7. The display device as claimed in claim 1, wherein the light emitting elements are configured to emit blue light.

8. A display device, comprising:
a thin film transistor substrate comprising a red pixel unit, a green pixel unit and a blue pixel unit, each comprising at least one thin film transistor;
a light emitting element on the red pixel unit, the green pixel unit, and the blue pixel unit, which are on the thin film transistor substrate;
a pixel electrode and a common electrode in the red pixel unit, the green pixel unit, and the blue pixel unit, and electrically connected to the light emitting element via a first contact electrode and a second contact electrode, respectively;
a pixel defining layer between the red pixel unit, the green pixel unit, and the blue pixel unit;
a red color conversion layer comprising a plurality of quantum dot materials and located on the light emitting element in the red pixel unit;
a green color conversion layer comprising a plurality of quantum dot materials and located on the light emitting element in the green pixel unit;
an insulator covering the light emitting element; and
a light blocking layer on the red and green color conversion layers,
wherein at least one from among the red and the green color conversion layers and the insulator are in an opening of the pixel defining layer,
wherein the red color conversion layer or the green color conversion layer is directly on the insulator,
wherein the first and second contact electrodes contact a bottom surface of the light emitting element facing away from the red color conversion layer, and
wherein the insulator contacts a top surface and the bottom surface of the light emitting element.

9. The display device as claimed in claim 8, further comprising an organic film on the red and green color conversion layers.

10. The display device as claimed in claim 8, wherein the insulator covers a side surface and a top surface of the light emitting element.

11. The display device as claimed in claim 8, wherein the pixel defining layer comprises a light blocking material.

12. The display device as claimed in claim 8, wherein the light emitting element is configured to emit blue light.

13. The display device as claimed in claim 8, wherein a height of a top surface of the red color conversion layer or a height of a top surface of the green color conversion layer is substantially equal to a height of a top surface of the pixel defining layer.

14. A display device comprising:
a thin film transistor substrate having a thin film transistor;
light emitting elements on the thin film transistor substrate and comprising a first light emitting element and a second light emitting element;
a pixel electrode connected to one end of the thin film transistor and electrically connected to the first or the second light emitting elements via a first contact electrode;
a common electrode electrically connected to one of the first or second light emitting elements via a second contact electrode;
a pixel defining layer including an opening at least partially exposing the one of the first or second light emitting elements;
an insulator between the one of the first or second light emitting elements and the pixel defining layer;
a color conversion layer comprising a red color conversion layer on the first light emitting element and a green color conversion layer on the second light emitting element of the display device, the red color conversion layer comprising a plurality of quantum dot materials, and the green color conversion layer comprising a plurality of quantum dot materials; and
a blue light blocking layer extending continuously over the red and green color conversion layers and the pixel defining layer,
wherein the first and second contact electrodes contact a bottom surface of the one of the first or second light emitting elements facing away from the color conversion layer, and
wherein the insulator contacts a top surface and the bottom surface of the one of the first or second light emitting elements.

15. The display device as claimed in claim 14, further comprising a passivation film overlapping the thin film transistor,
wherein the pixel electrode and the common electrode are on the passivation film.

16. The display device as claimed in claim 14, wherein the light emitting elements are configured to emit blue light.

17. The display device as claimed in claim 14, wherein the light emitting elements comprise a third light emitting element configured to emit blue light.

* * * * *